(12) United States Patent
Lee

(10) Patent No.: US 8,736,313 B2
(45) Date of Patent: May 27, 2014

(54) INPUT BUFFER CAPABLE OF EXPANDING AN INPUT LEVEL

(71) Applicant: SK hynix Inc., Icheon-si (KR)

(72) Inventor: Dong Uk Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/860,183

(22) Filed: Apr. 10, 2013

(65) Prior Publication Data

US 2013/0222039 A1    Aug. 29, 2013

Related U.S. Application Data

(63) Continuation of application No. 13/030,337, filed on Feb. 18, 2011, now Pat. No. 8,436,661.

(30) Foreign Application Priority Data

Apr. 6, 2010    (KR) .................. 10-2010-0031387

(51) Int. Cl.
*H03K 3/00*    (2006.01)

(52) U.S. Cl.
USPC ............................................. 327/89; 327/108

(58) Field of Classification Search
USPC .................................................... 327/89, 108
See application file for complete search history.

(56) References Cited

U.S. PATENT DOCUMENTS 5,039,881 A *   8/1991  Ooms et al. ...................... 326/18
5,834,974 A *  11/1998  Kim ............................. 330/253
7,268,625 B2 *  9/2007  Shin ............................. 330/261

* cited by examiner

*Primary Examiner* — Kenneth B. Wells
(74) *Attorney, Agent, or Firm* — William Park & Associates Patent Ltd.

(57) ABSTRACT

An input buffer includes a first amplification block, a second amplification block, and a buffer block. The first amplification block is configured to be driven by an external voltage, to differentially amplify an input signal and a reference voltage in response to a bias voltage, and to subsequently generate first and second differential signals. The second amplification block is configured to be driven by an internal voltage, to differentially amplify the first and second differential signals, and to generate an output signal. The buffer block is configured to be driven by the internal voltage, to buffer the output signal, and to output an inverted output signal.

13 Claims, 6 Drawing Sheets

INPUT BUFFER CAPABLE OF EXPANDING AN INPUT LEVEL

CROSS-REFERENCES TO RELATED APPLICATIONS

The present application claims priority under 35 U.S.C. 119(a) to Korean Application No. 10-2010-0031387, filed on Apr. 6, 2010, in the Korean intellectual property Office, which is incorporated herein by reference in its entirety set forth in full. The parent application Ser. No. 13/030,337 has now issued as U.S. Pat. No. 8,436,661.

BACKGROUND

In general, a semiconductor chip is mounted on a printed circuit board (PCB), which is an important component of a system configuration, and the semiconductor chip is supplied with a driving voltage that is appropriate for performing the logic and functions associated with its intended use. In order to perform such a logic and function, the semiconductor chip receives a signal applied from a component exterior to the semiconductor chip.

An input buffer is designed to buffer an external signal and input the buffered signal to inside the semiconductor chip. The simplest input buffer is the static input buffer. The static input buffer is implemented as an inverter type in which a PMOS transistor and an NMOS transistor are coupled in series between a power supply voltage terminal and a ground voltage terminal. The static input buffer has an advantage in that its configuration is very simple. However, the static input buffer has weak resistance to noise, and it is therefore ineffective for use in a semiconductor chip having a narrow swing width or requiring a high operating frequency.

Therefore, a differential amplifier type input buffer having a strong resistance to noise is used in a semiconductor chip having a narrow swing width or requiring a high operating frequency.

FIG. 1 is a circuit diagram of a conventional input buffer.

As illustrated in FIG. 1, the conventional input buffer includes an amplification unit 100 and a buffer unit 110. The amplification unit 100 is driven by an external voltage VEXT in response to an enable signal EN to differentially amplify an input signal IN and a reference voltage VREF and thereby generate an output signal OUT. The buffer unit 110 is driven by an internal voltage VINT to buffer the output signal OUT and output an inverted output signal OUTB. The amplification unit 100 is an interface circuit which directly receives the input signal applied from the exterior. The buffer unit 110 is an internal circuit which buffers the output signal OUT differentially amplified in the amplification unit 100. In order to improve the operational reliability and reduce current consumption, the buffer unit 110 is driven by the internal voltage VINT, which is maintained at a more stable level than that of the external voltage VEXT.

However, since the level of the output signal OUT outputted by the amplification unit 100 is dependent on the level of the input signal IN and the level of the reference voltage VREF, the input level range of the reference voltage VREF is limited. Furthermore, while the output signal OUT inputted to the buffer unit 110 is driven by the external voltage VEXT having a level ranging from 1.5 V to 2.0 V, the inverted output signal OUTB outputted from the buffer unit 110 is driven by the internal voltage VINT having a level ranging from 1.2 V to 1.4 V. Consequently, the duty cycle of the output signal OUT is different from the duty cycle of the inverted output signal OUTB.

Referring to FIG. 2, when the duty cycle of the output signal OUT is 50%, that is, the high level pulse width X1 is equal to the low level pulse width X2, the duty cycle of the inverted output signal OUTB is less than 50%. That is, the low level pulse width Y1 of the inverted output signal OUTB is larger than the high level pulse width Y2. This occurs because the inverted output signal OUTB is driven by the internal voltage VINT having a lower level than that of the external voltage VEXT.

Accordingly, even though the circuit can provide an output signal OUT having the duty cycle of 50%, the duty cycle of the inverted output signal OUTB driven by the internal voltage VINT is less than 50%, causing a duty cycle error. As the duty cycle error increases, the characteristics of the input buffer are degraded.

SUMMARY

Various embodiments of the present invention include an input buffer which is capable of expanding the input level range of a reference voltage and minimizing duty cycle error.

In an embodiment, an input buffer includes: a first amplification block configured to be driven by an external voltage, differentially amplify an input signal and a reference voltage in response to a bias voltage, and generate first and second differential signals; a second amplification block configured to be driven by an internal voltage, differentially amplify the first and second differential signals, and generate an output signal; and a buffer block configured to be driven by the internal voltage, buffer the output signal, and output an inverted output signal.

In another embodiment, an input buffer includes: a bias voltage generation block configured to compare a signal generated by amplifying a reference voltage with a signal generated by dividing an internal voltage, and generate a bias voltage; a first amplification block configured to be driven by an external voltage, differentially amplify an input signal and the reference voltage in response to the bias voltage, and generate first and second differential signals; and a second amplification block configured to be driven by the internal voltage, differentially amplify the first and second differential signals, and generate an output signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
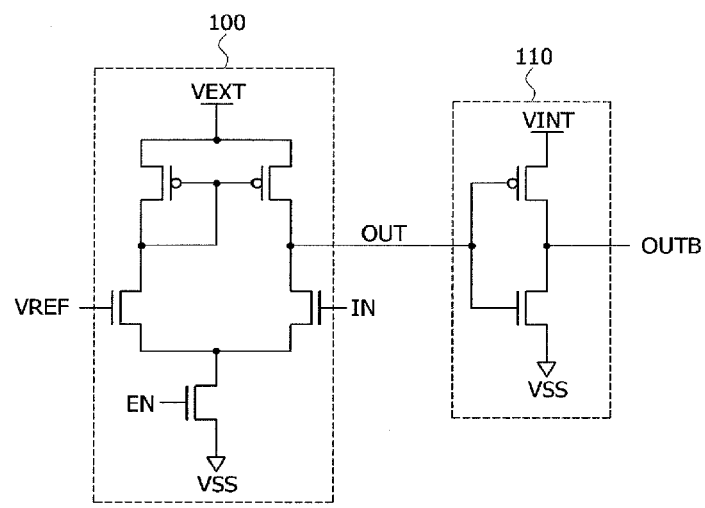
FIG. 1 is a circuit diagram of a conventional input buffer.
Figure 2:
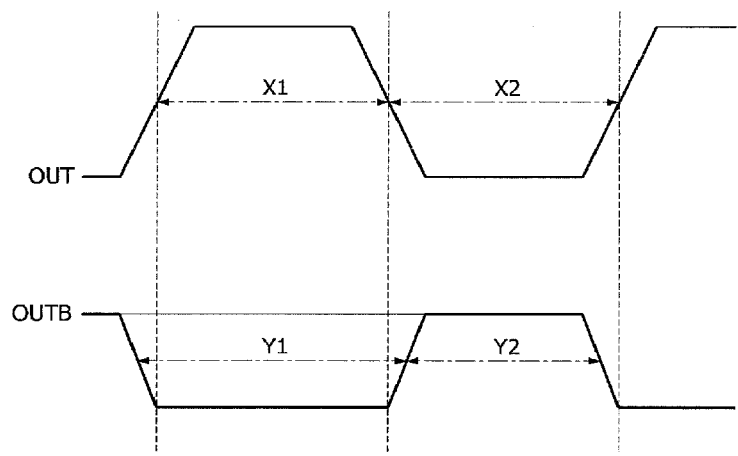
FIG. 2 is a waveform diagram of an output signal and an inverted output signal of the input buffer illustrated in FIG. 1.
Figure 3:
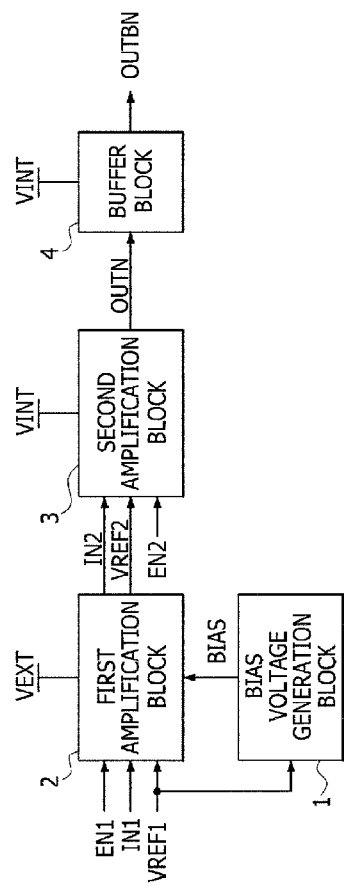
FIG. 3 is a block diagram illustrating a configuration of an input buffer according to an embodiment of the present invention.

FIG. 3 is a block diagram showing a configuration of an input buffer according to an embodiment of the present invention.

As illustrated in FIG. 3, the input buffer according to an embodiment of the present invention includes a bias voltage generation block 1, a first amplification block 2, a second amplification block 3, and a buffer block 4.

Figure 4A:
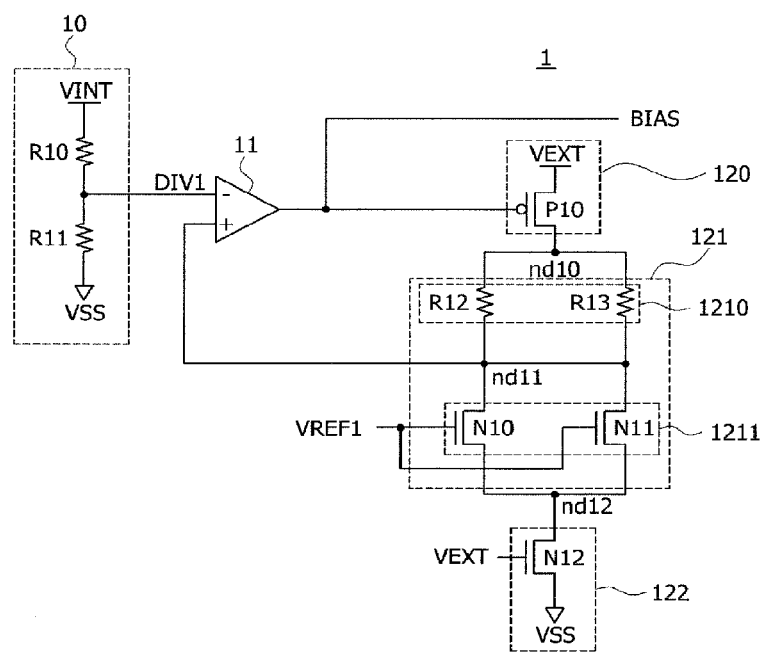
FIGS. 4A and 4B are circuit diagrams illustrating a bias voltage generation block included in the input buffer of FIG. 3 according to embodiments of the present invention.
Figure 4B:
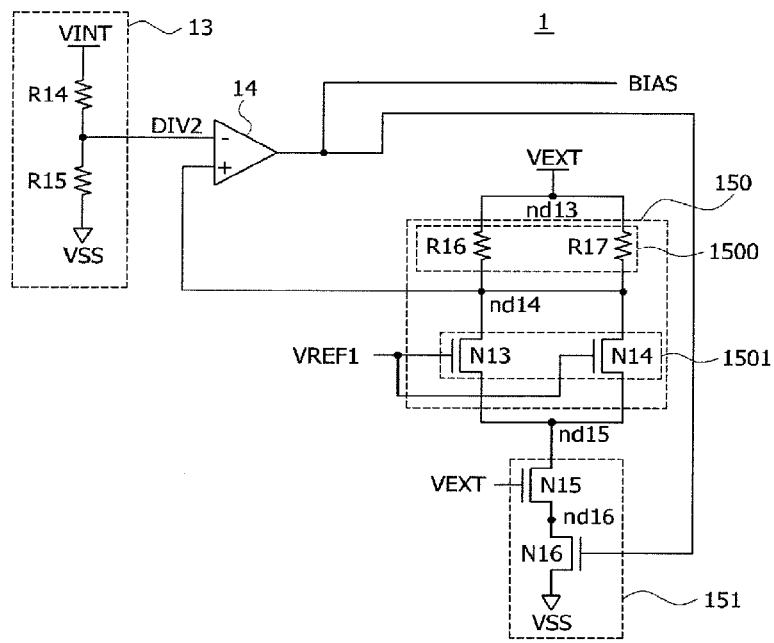

The bias voltage generation block 1 is configured to compare a signal generated by amplifying a reference voltage VREF1 with a signal generated by dividing an internal voltage VINT in order to generate a bias voltage BIAS. Exemplary embodiments of the bias voltage generation block 1 for performing such an operation are illustrated in FIGS. 4A and 4B. Detailed configurations of the respective embodiments will be described below.

Referring to FIG. 4A, the bias voltage generation block 1 illustrated in FIG. 4A includes a first voltage division unit 10, a comparator 11, a first switch unit 120, a first reference voltage amplification unit 121, and a first driving control unit 122. The first voltage division unit 10 is configured to generate a first division voltage DIV1 obtained by dividing the internal voltage VINT according to a resistance ratio of resistors R10 and R11. The comparator 11 is configured to compare the first division voltage DIV1 with a signal of a node nd11 (described in more detail below) in order to generate the bias voltage BIAS. The first switch unit 120 is configured to be turned on in response to the bias voltage and is operated dependent the level of the bias voltage BIAS so as to control driving of a node nd10 in accordance with an external voltage VEXT. The first reference voltage amplification unit 121 is configured to amplify the reference voltage VREF1 and output the amplified reference voltage VREF1 to the node nd11. As noted above, the amplified reference voltage VREF1 output to node nd11 is compared to the first division voltage by the comparator 11 and the bias voltage BIAS is a result of this comparison. The first driving control unit 122 is configured to receive the external voltage VEXT and control driving of the first reference voltage amplification unit 121. In an embodiment, the level of the first division voltage DIV1 may be set to be half the level of the internal voltage VINT. In another embodiment, the level of the first division voltage DIV1 may be set to 60-80% of the level of the internal voltage VINT. Such an embodiment may be beneficial when the interval voltage VINT is relatively low.

The circuit configuration of the bias voltage generating block according to the embodiment shown in FIG. 4A will now be described in more detail. The first switch unit 120 includes a PMOS transistor P10 coupled between an external voltage (VEXT) terminal and the node nd10. The PMOS transistor P10 is configured to be turned on in response to the bias voltage BIAS. The first reference voltage amplification unit 121 includes a first load section 1210 and a first input section 1211. The first load section 1210 is implemented with resistors R12 and R13 coupled in parallel between the node nd10 and the node n11. The first input section 1211 is implemented with NMOS transistors N10 and N11 coupled in parallel between the node n11 and a node nd12. Each of the NMOS transistors N10 and N11 is configured to receive the reference voltage VREF1. The first driving control unit 122 includes an NMOS transistor N12 coupled between the node nd12 and a ground voltage (VSS) terminal and configured to be turned on in response to the external voltage VEXT.

The bias voltage generation block 1 having the above-described configuration sets the level of the bias voltage BIAS such that the voltage of the node nd11 becomes substantially equal to the division voltage DIV generated by dividing the internal voltage VINT. Thus, the level of the bias voltage BIAS is dependent on the level of the interval voltage VINT.

Referring now to FIG. 4B, the bias voltage generation block 1 illustrated in FIG. 4B includes a second voltage division unit 13, a comparator 14, a second reference voltage amplification unit 150, and a second driving control unit 151. The second voltage division unit 13 is configured to generate a second division voltage DIV2 obtained by dividing the internal voltage VINT according to a resistance ratio of resistors R14 and R15. The comparator 14 is configured to compare the second division voltage DIV2 with a signal of a node nd14 (described in more detail below) in order to generate the bias voltage BIAS. The second reference voltage amplification unit 150 is configured to amplify the reference voltage VREF1 and output the amplified reference voltage VREF1 to the node nd14. As noted above, the amplified reference voltage VREF1 output to node nd14 is compared to the second division voltage by the comparator 14 with the bias voltage BIAS being the result of this comparison. The second driving control unit 151 is configured to receive the external voltage VEXT and control driving of the second reference voltage amplification unit 150. In an embodiment, the level of the second division voltage DIV2 may be set to be half the level of the internal voltage VINT. In another embodiment, for example, when the interval voltage VINT is low, the second division voltage DIV2 may be set to 60-80% of the level of the internal voltage VINT.

The circuit configuration of the bias voltage generating block according to the embodiment shown in FIG. 4A will now be described in more detail. The second reference voltage amplification unit 150 includes a second load section 1500 and a second input section 1501. The second load section 1500 is implemented with resistors R16 and R17 coupled in parallel between a node nd13 and a node n14. The second input section 1501 is implemented with NMOS transistors N13 and N14 coupled in parallel between the node n14 and a node nd15. Each of the NMOS transistors N10 and N11 is configured to receive the reference voltage VREF1. The second driving control unit 151 includes an NMOS transistor N15 and an NMOS transistor N16. The NMOS transistor N15 is coupled between the node nd15 and a node nd16 and is configured to be turned on in response to the external voltage VEXT. The NMOS transistor N16 is coupled between the node nd16 and the ground voltage (VSS) terminal and is configured to be turned on in response to the bias voltage BIAS.

The bias voltage generation block 1 having the above-described configuration sets the level of the bias voltage BIAS such that the voltage of the node nd14 becomes substantially equal to the division voltage DIV generated by dividing the internal voltage VINT. Thus, the level of the bias voltage BIAS is dependent on the level of the interval voltage VINT.

Figure 5A:
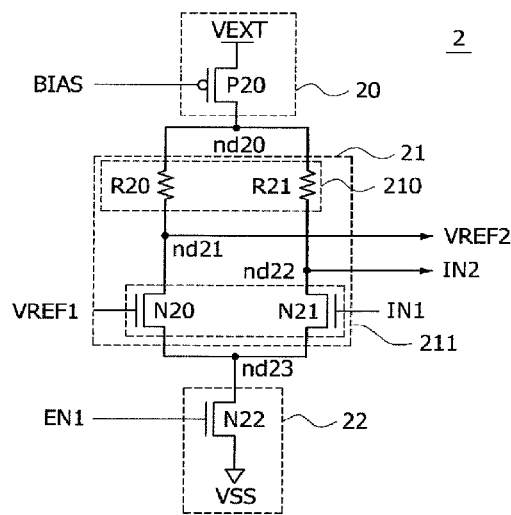
FIGS. 5A to 5C are circuit diagrams illustrating a first amplification block included in the input buffer of FIG. 3 according to embodiments of the present invention.
Figure 5B:
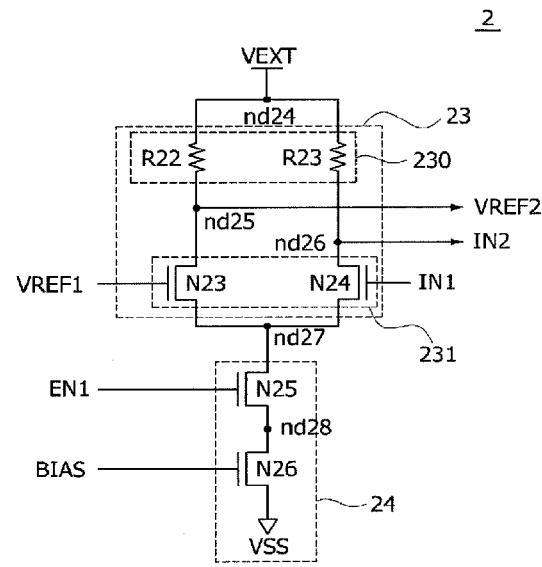
Figure 5C:
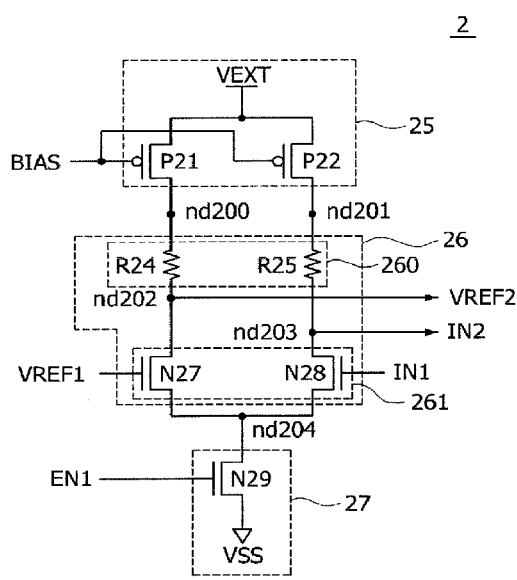

Referring again to FIG. 3, the first amplification block 2 is driven by the external voltage VEXT and is configured to differentially amplify the reference voltage VREF1 and the input signal IN1 in response to the bias voltage BIAS so as to generate a first differential signal VREF2 and a second differential signal IN2. Exemplary embodiments of the first amplification block 2 for performing such an operation are illustrated in FIGS. 5A, 5B and 5C. Detailed configurations of the respective embodiments will be described below.

Referring to FIG. 5A, the first amplification block 2 illustrated in FIG. 5A includes a second switch unit 20, a first differential amplification unit 21, and a third driving control unit 22. The second switch unit 20 is configured to be turned on in response to the bias voltage BIAS and is operated dependent upon the level of the bias voltage BIAS so as to control driving of a node nd20 in accordance with the external voltage VEXT. In other words, the voltage levels of the nodes nd200 and nd201 are dependent upon the bias voltage BIAS. The first differential amplification unit 21 is configured to differentially amplify the input signal IN1 and the reference voltage VREF1 in order to output the first differential signal VREF2 to a node nd21, and output the second differential signal IN2 to a node nd22. The third driving control unit 22 is configured to receive a first enable signal EN1 and control driving of the first differential amplification unit 21.

The circuit configuration of the first amplification block 2 shown in FIG. 5A will now be described in more detail. The second switch unit 20 includes a PMOS transistor P20 coupled between the external voltage (VEXT) terminal and the node nd20. The PMOS transistor P20 is configured to be turned on in response to the bias voltage BIAS. The first differential amplification unit 21 includes a third load section 210 and a third input section 211. The third load section 210 is implemented with resistors R20 and R21 coupled in parallel between the node nd20 and nodes nd21 and nd22. The third input section 211 is implemented with NMOS transistors N20 and N21 coupled in parallel between the nodes nd21 and nd22 and node nd23. The NMOS transistors N20 and N21 are configured to receive the reference voltage VREF1 and the input signal IN1, respectively. The third driving control unit 22 includes an NMOS transistor N22 coupled between the node nd23 and the ground voltage (VSS) terminal. The third driving control unit 22 is configured to be turned on in response to the first enable signal EN1. In the embodiment shown in FIG. 5A, the first enable signal EN1 is a signal that is enabled at a logic high level in response to the input of the input signal IN1.

In the first amplification block 2 having the above-described configuration, since the node nd20 is driven according to the level of the bias voltage BIAS (i.e., the voltage applied to the node nd20 is dependent upon the bias voltage BIAS), the respective levels of the first differential signal VREF2 and the second differential signal IN2 are dependent on the bias voltage BIAS. Furthermore, since the bias voltage BIAS is dependent on the level of the division voltage DIV which is generated by dividing the internal voltage VINT, the respective levels of the differential signal VREF2 and the second differential signal IN2 are dependent on the level of the internal voltage VINT.

Referring to FIG. 5B, the first amplification block 2 illustrated in FIG. 5B includes a second differential amplification unit 23 and a fourth driving control unit 24. The second differential amplification unit 23 is configured to differentially amplify the input signal IN1 and the reference voltage VREF1 in order to output the first differential signal VREF2 to a node nd25 and to output the second differential signal IN2 to a node nd26. The fourth driving control unit 24 is configured to receive the first enable signal EN1 and the bias voltage BIAS in order to control driving of the second differential amplification unit 23.

The circuit configuration of the first amplification block 2 shown in FIG. 5B will now be described in more detail. The second differential amplification unit 23 includes a fourth load section 230 and a fourth input section 231. The fourth load section 230 is implemented with resistors R22 and R23 coupled in parallel between the node nd24 and nodes nd25 and nd26. The fourth input section 231 is implemented with NMOS transistors N23 and N24 coupled in parallel between the nodes nd25 and nd26 and node nd27. The NMOS transistors N23 and N24 are configured to receive the reference voltage VREF1 and the input signal IN1, respectively. The fourth driving control unit 24 includes an NMOS transistor N25 and an NMOS transistor N26. The NMOS transistor N25 is coupled between the node nd27 and the node nd28 and is configured to be turned on in response to the first enable signal EN1. The NMOS transistor N26 is coupled between the node nd28 and the ground voltage (VSS) terminal and is configured to be turned on in response to the bias voltage BIAS. In the embodiment shown in FIG. 5B, the first enable signal EN1 is a signal that is enabled at a logic high level in response to the input of the input signal IN1.

In the first amplification block 2 having the above-described configuration, since the node nd24 is driven according to the level of the bias voltage BIAS (i.e., the voltage applied to the node nd20 is dependent upon the bias voltage), the respective levels of the first differential signal VREF2 and the second differential signal IN2 are dependent on the bias voltage BIAS. Furthermore, since the bias voltage BIAS is dependent on the level of the division voltage DIV which is generated by dividing the internal voltage VINT, the respective levels of the differential signal VREF2 and the second differential signal IN2 are dependent on the level of the internal voltage VINT.

Referring to FIG. 5C, the first amplification block 2 illustrated in FIG. 5C includes a third switch unit 25, a third differential amplification unit 26, and a fifth driving control unit 27. The third switch unit 25 is configured to be turned on in response to the bias voltage BIAS and is operated dependent upon the level of the bias voltage BIAS so as to control driving of nodes nd200 and nd201 in accordance with the external voltage VEXT. In other words, the voltage levels of the nodes nd200 and nd201 are dependent upon the bias voltage BIAS. The third differential amplification unit 26 is configured to differentially amplify the input signal IN1 and the reference voltage VREF1, output the first differential signal VREF2 to a node nd202, and output the second differential signal IN2 to a node nd203. The fifth driving control unit 27 is configured to receive a first enable signal EN1 and control a driving of the third differential amplification unit 26.

More specifically, the third switch unit 25 includes PMOS transistors P21 and P22 coupled between the external voltage (VEXT) terminal and the nodes nd200 and nd201 and is configured to be turned on in response to the bias voltage BIAS. The third differential amplification unit 26 includes a fifth load section 260 and a fifth input section 261. The fifth load section 260 is implemented with resistors R24 and R25 coupled in parallel between the nodes nd200 and nd201 and the nodes nd202 and nd203. The fifth input section 261 is implemented with NMOS transistors N27 and N28 coupled in parallel between the nodes nd202 and nd203 and the node nd204, and is configured to receive the reference voltage VREF1 and the input signal IN1. The fifth driving control unit 27 includes an NMOS transistor N29 coupled between the node nd204 and the ground voltage (VSS) terminal and configured to be turned on in response to the first enable signal EN1. The first enable signal EN1 is a signal which is enabled to a logic high level according to the input of the input signal IN1.

In the first amplification block 2 having the above-described configuration, since the nodes nd200 and nd201 are driven according to the level of the bias voltage BIAS, the levels of the first differential signal VREF2 and the second differential signal IN2 are dependent on the bias voltage BIAS. Furthermore, since the bias voltage BIAS is dependent on the level of the division voltage DIV which is generated by dividing the internal voltage VINT, the levels of the differential signal VREF2 and the second differential signal IN2 are dependent on the level of the internal voltage VINT.

Figure 6:
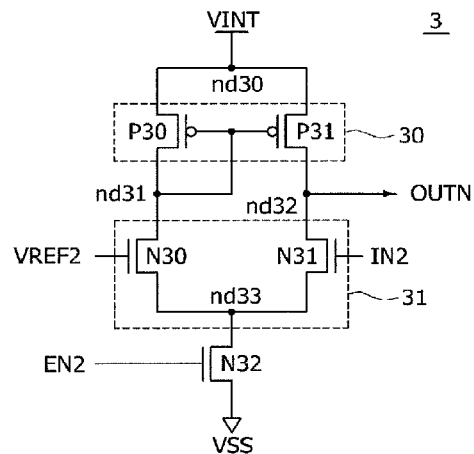
FIG. 6 is a circuit diagram illustrating a second amplification block included in the input buffer of FIG. 2.

As illustrated in FIG. 6, the second amplification block 3 includes a current mirror section 30, a sixth input section 31, and an NMOS transistor N32. The current mirror section 30 is provided to operate as a constant current source, and includes a PMOS transistor P30 and a PMOS transistor P31. The PMOS transistor P30 is coupled between a node nd30, through which the internal voltage VINT is supplied, and a node nd31, and is configured to be turned on in response to a signal of the node nd31. The PMOS transistor P31 is coupled between the node nd30 and a node nd32, through which the output signal OUTN is outputted, and is configured to be turned on in response to the signal of the node nd31. The sixth input unit 31 includes an NMOS transistor N30 and an NMOS transistor N31. The NMOS transistor N30 is coupled between the node nd31 and a node nd33 and is configured to be turned on in response to the first differential signal VREF2. The NMOS transistor N31 is coupled between the node nd32 and the node nd33 and is configured to be turned on in response to the second differential signal IN2. The NMOS transistor N32 is coupled between the node nd33 and the ground voltage (VSS) terminal and is configured to be turned on in response to a second enable signal EN2 of a logic high level to control a driving of the node nd33. The second enable signal EN2 is a signal which is enabled to a logic high level according to the input of the second differential signal IN2. In some embodiments, the second enable signal EN2 may be set so that it is enabled at the same time with the first enable signal EN1, or may be set so that it is enabled after a predetermined delay time.

The second amplification block 3 having the above-described configuration differentially amplifies the first differential signal VREF2 and the second differential signal IN2 and generates the output signal OUTN. That is, the first differential signal VREF2 and the second differential signal IN2 are generated by differentially amplifying the input signal IN1 and the reference voltage VREF1, which are inputted from the exterior, through the first amplification block 2. Then, the output signal OUTN is generated by differentially amplifying the first differential signal VREF2 and the second differential signal IN2 through the second amplification block 3. Therefore, since the level of the output signal OUTN driven by the internal voltage VINT is not directly dependent on the levels of the input signal IN1 and the reference voltage VREF1 inputted from the exterior, then the level range of the reference voltage VREF1 which can be inputted to the first amplification block 2 is expanded.

Figure 7:
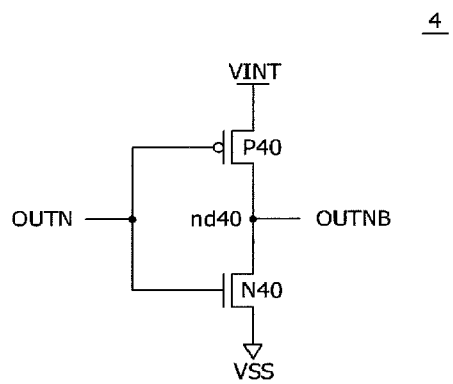
FIG. 7 is a circuit diagram illustrating a buffer block included in the input buffer of FIG. 3.

As illustrated in FIG. 7, the buffer block 4 includes a PMOS transistor P40 and an NMOS transistor N40. The PMOS transistor P40 is coupled between the internal voltage (VINT) terminal and a node nd40 and configured to pull-up drive the inverted output signal OUTNB in response to the output signal OUTN. The NMOS transistor N40 is coupled between the node nd40 and the ground voltage (VSS) terminal and configured to pull-down drive the inverted output signal OUTNB in response to the output signal OUTN. The buffer block 4 having the above-described configuration generates the inverted output signal OUTNB by inverting and buffering the output signal OUTN. Since the output signal OUTN is driven by the internal voltage VINT and the inverted output signal OUTNB is also driven by the internal voltage VINT through the buffer block 4, the duty cycles of the output signal OUTN and the inverted output signal OUTNB are constantly maintained.

The bias voltage generation block 1 included in the input buffer according to the foregoing embodiments may be implemented as illustrated in FIGS. 4A and 4B, and the first amplification block 2 may be implemented as illustrated in FIGS. 5A to 5C.

When the bias voltage generation block 1 is implemented with the circuit illustrated in FIG. 4A, the first amplification block 2 may be implemented with the circuit illustrated in FIG. 5A. This is because the first switch unit 120, the first reference voltage amplification unit 121, and the first driving control unit 122 of the bias voltage generation block 1 illustrated in FIG. 4A are a replica circuit of the first amplification block 2 illustrated in FIG. 5A. The elements included in the first switch unit 120, the first reference voltage amplification unit 121, and the first driving control unit 122 of the bias voltage generation block 1 illustrated in FIG. 4A may be implemented to have the same sizes and characteristics as those of the first amplification block 2 illustrated in FIG. 5A.

Furthermore, when the bias voltage generation block 1 is implemented with the circuit illustrated in FIG. 4B, the first amplification block 2 may be implemented with the circuit illustrated in FIG. 5B. This is because the second reference voltage amplification unit 150 and the second driving control unit 151 of the bias voltage generation block 1 illustrated in FIG. 4B are a replica circuit of the first amplification block 2 illustrated in FIG. 5B. The elements included in the second reference voltage amplification unit 150 and the second driving control unit 151 of the bias voltage generation block 1 illustrated in FIG. 4B may be implemented to have the same sizes and characteristics as those of the first amplification block 2 illustrated in FIG. 5B.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:
1. An input buffer comprising:
   a first amplification block configured to be driven by an external voltage and differentially amplify an input signal and a reference voltage in response to a bias voltage generated by comparing a division voltage with an amplified reference voltage signal, and generate first and second differential signals; and
   a second amplification block configured to be driven by an internal voltage and differentially amplify the first and second differential signals and generate an output signal,
   wherein the division voltage is generated from the internal voltage, and the amplified reference voltage signal is generated from the reference voltage.
2. The input buffer of claim 1, wherein the levels of the first and second differential signals are adjusted by the bias voltage.
3. The input buffer of claim 1, wherein the first amplification block comprises:
   a first switch unit configured to be turned on according to the bias voltage and control driving of a first node according to the external voltage; and
   a differential amplification unit coupled between the first node and a second node and configured to differentially amplify the input signal and the reference voltage and generate the first and second differential signals.
4. The input buffer of claim 3, wherein the differential amplification unit comprises:
   a load section coupled between the first node and a third node through which the first differential signal is outputted, and the load section coupled between the first node and a fourth node through which the second differential signal is outputted; and an input section coupled between the third node and the second node, and the input section coupled between the fourth node and the second node, and the input section configured to receive the input signal and the reference voltage and configured to adjust voltage levels of the third node and the fourth node.

5. The input buffer of claim 3, wherein the first amplification block further comprises a driving control unit coupled to the second node and configured to control driving of the differential amplification unit in response to an enable signal.

6. The input buffer of claim 3, further comprising:
a second switch unit configured to be turned on according to the bias voltage and control driving of a third node according to the external voltage;
a reference voltage amplification unit coupled between the third node and a fourth node and configured to amplify and output the reference voltage;
a voltage division unit configured to divide the internal voltage and generate the division voltage; and
a comparator configured to compare the division voltage with the amplified reference voltage signal outputted from the reference voltage amplification unit, and configured to generate the bias voltage.

7. The input buffer of claim 6, wherein the reference voltage amplification unit comprises:
a load section coupled between the third node and a fifth node through which the amplified reference voltage signal is outputted; and
an input section coupled between the fifth node and the fourth node and configured to receive the reference voltage and adjust a level of the fifth node.

8. The input buffer of claim 6, further comprising a driving control unit coupled to the fourth node and configured to control driving of the reference voltage amplification unit in response to the external voltage.

9. The input buffer of claim 1, wherein the first amplification block comprises:
a differential amplification unit coupled between an external voltage terminal and a first node and configured to differentially amplify the input signal and the reference voltage and generate the first and second differential signals; and
a driving control unit coupled to the first node and configured to control driving of the differential amplification unit in response to the bias voltage and an enable signal.

10. The input buffer of claim 9, wherein the differential amplification unit comprises:
a load section coupled between the external voltage terminal and a second node through which the first differential signal is outputted, and the load section coupled between the external voltage terminal and a third node through which the second differential signal is outputted; and
an input section coupled between the second and third nodes and that of the first node and the input section is configured to receive the input signal and the reference voltage and is configured to adjust voltage levels of the second and third nodes.

11. The input buffer of claim 9, further comprising:
a reference voltage amplification unit coupled between the external voltage terminal and a second node and configured to amplify and output the reference voltage;
a voltage division unit configured to divide the internal voltage and generate the division voltage; and
a comparator configured to compare the division voltage with the amplified reference voltage signal outputted from the reference voltage amplification unit, and configured to generate the bias voltage.

12. The input buffer of claim 11, wherein the reference voltage amplification unit comprises:
a load section coupled between the external voltage terminal and a third node through which the amplified reference voltage signal is outputted; and
an input section coupled between the third node and the second node and configured to receive the reference voltage and adjust a level of the amplified reference voltage signal at the third node.

13. The input buffer of claim 1, wherein the second amplification block comprises:
a current mirror section configured to receive the internal voltage and a signal at a first node and operate substantially as a constant current source;
an input section coupled between the first node, a second node through which the output signal is outputted, and that of a third node, and the input section is configured to receive the first and second differential signals and is configured control driving of the second node and the third node; and
a driving control element coupled to the third node and configured to control driving of the input section in response to an enable signal.

* * * * *